US012624993B2

(12) United States Patent
Chen et al.

(10) Patent No.: US 12,624,993 B2
(45) Date of Patent: May 12, 2026

(54) SENSING DEVICE AND METHOD FOR FABRICATING THE SAME

(71) Applicant: AUO Corporation, Hsinchu (TW)

(72) Inventors: Te-Ming Chen, Hsinchu (TW);
Tsung-Han Chen, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 797 days.

(21) Appl. No.: 17/890,275

(22) Filed: Aug. 18, 2022

(65) Prior Publication Data

US 2023/0228623 A1      Jul. 20, 2023

Related U.S. Application Data

(60) Provisional application No. 63/300,734, filed on Jan. 19, 2022.

(30) Foreign Application Priority Data

Jun. 17, 2022    (TW) ................................. 111122700

(51) Int. Cl.
*H10F 39/10*       (2025.01)
*G01J 1/44*        (2006.01)
*H10D 86/01*       (2026.01)
*H10F 39/00*       (2025.01)

(52) U.S. Cl.
CPC .............. *G01J 1/44* (2013.01); *H10F 39/024* (2025.01); *H10F 39/8067* (2025.01); *G01J 2001/446* (2013.01)

(58) Field of Classification Search
CPC ...... H10F 39/107; H10F 39/90; H10F 39/806; H10F 39/8067; H10F 39/191–1935; H10F 39/18–1847; H10F 39/189–1895; H10D 86/021; H10D 86/40; H10D 86/411; H10D 86/441; H10K 77/10; H10K 77/111

See application file for complete search history.

(56) References Cited

U.S. PATENT DOCUMENTS

| | | | |
|---|---|---|---|
| 11,289,531 B2 | 3/2022 | Zhang et al. | |
| 2002/0145676 A1* | 10/2002 | Kuno ..................... | H04N 23/55 257/E31.127 |
| 2017/0309844 A1* | 10/2017 | Saeki ....................... | G02B 5/20 |
| 2019/0129554 A1 | 5/2019 | Kim | |
| 2021/0143207 A1* | 5/2021 | Zhang ................... | H10F 39/811 |
| 2022/0093658 A1* | 3/2022 | Chen ..................... | H10F 39/802 |

FOREIGN PATENT DOCUMENTS

| | | |
|---|---|---|
| CN | 106299017 | 1/2017 |
| CN | 110797365 | 2/2020 |
| CN | 113506816 | 10/2021 |

* cited by examiner

*Primary Examiner* — Jay C Kim
*Assistant Examiner* — John Lin
(74) *Attorney, Agent, or Firm* — JCIPRNET

(57)                ABSTRACT
A sensing device includes a flexible substrate, a reflective layer, a planarization layer, plural switching elements and plural sensing elements. The flexible substrate has plural recesses on a surface. The reflective layer is located on the flexible substrate and conforms to an inner surface of the plural recesses. The planarization layer is disposed on the reflective layer. The plural switching elements are disposed on the planarization layer. The plural sensing elements are disposed on the planarization layer and electrically connected to the plural switching elements respectively. A method for fabricating a sensing device is also provided.

12 Claims, 11 Drawing Sheets

10

SENSING DEVICE AND METHOD FOR FABRICATING THE SAME

CROSS-REFERENCE TO RELATED APPLICATION

This application claims the priority benefit of U.S. provisional application Ser. No. 63/300,734, filed on Jan. 19, 2022 and Taiwan application serial no. 111122700, filed on Jun. 17, 2022. The entirety of each of the above-mentioned patent applications is hereby incorporated by reference herein and made a part of this specification.

BACKGROUND

Technical Field

The disclosure relates to a photoelectric device and a method for fabricating the same, and in particular relates to a sensing device and a method for fabricating the same.

Description of Related Art

Due to its excellent performance, optical sensors have been widely used in security inspection, industrial inspection, medical diagnosis, and other fields. For example, in medical diagnosis, X-ray sensors may be used for image capture of human chest cavity, blood vessels, teeth, etc. Generally speaking, such sensors mainly include thin film transistors (TFTs) and photodiodes. The photodiode may convert light energy into electrical signals, and the thin film transistor is used to read the electrical signal measured by the photodiode.

Traditionally, an electrostatic protection layer is bonded on the back of the substrate of this type of sensor, usually an aluminum film or a conductive film. However, when the substrate is bonded with a conductive film, gaps, such as air bubbles, may be formed because the substrate may not be completely bonded, which causes an interference of light reflection that penetrates the gap and reaches the conductive film, resulting in uneven brightness of the sensing image which affects the sensing quality.

SUMMARY

The disclosure provides a sensing device with good sensing quality.

The disclosure provides a method for fabricating a sensing device, which may provide a sensing device with good sensing quality.

An embodiment of the disclosure provides a sensing device, including: a flexible substrate having multiple recesses on a surface; a reflective layer is located on the flexible substrate and conforms to an inner surface of the recesses; a planarization layer, located on the reflective layer; multiple switching elements located on the planarization layer; and multiple sensing elements located on the planarization layer and electrically connected to the switching elements respectively.

In an embodiment of the disclosure, the inner surface of the recesses has a side surface and a bottom surface that are planar, or an arc-shaped surface.

In an embodiment of the disclosure, an opening width of the recesses is greater than a width of the bottom surface.

In an embodiment of the disclosure, the recesses surround one sensing element and one switching element, or the recesses surround four sensing elements and four switching elements.

In an embodiment of the disclosure, a ratio of a depth of the recesses to a thickness of the planarization layer is 0.5 to 0.95.

In an embodiment of the disclosure, the reflective layer has a floating potential or a grounding potential.

In an embodiment of the disclosure, a refractive index difference between the reflective layer and the planarization layer is not less than 0.4.

In an embodiment of the disclosure, the sensing device further includes a data line and a scan line, which are electrically connected to the switching elements. A gap between an orthographic projection of the data line, the scan line, and the sensing element on the flexible substrate completely overlaps an orthographic projection of the recesses on the flexible substrate.

In an embodiment of the disclosure, the flexible substrate is a film type polyimide (PI).

In an embodiment of the disclosure, a thickness of the flexible substrate is 40 μm to 400 μm.

In an embodiment of the disclosure, the planarization layer includes varnish polyimide (PI).

In an embodiment of the disclosure, a thickness of the planarization layer is 5 μm to 50 μm.

An embodiment of the disclosure provides a method for fabricating a sensing device, including the following process. A flexible substrate is formed on a carrier, and a surface of the flexible substrate has multiple recesses. A reflective layer is formed on the flexible substrate, and the reflective layer conforms to an inner surface of the recesses. A planarization layer is formed on the reflective layer, and the planarization layer fills the recesses.

In an embodiment of the disclosure, the carrier is a glass substrate.

In an embodiment of the disclosure, the recesses are formed by imprinting.

In an embodiment of the disclosure, a surface flatness of the planarization layer is not less than 90%.

In an embodiment of the disclosure, the method for fabricating the sensing device further includes forming multiple switching elements and multiple sensing elements on the planarization layer. The sensing elements are electrically connected to the switching elements respectively.

In an embodiment of the disclosure, the method for fabricating the sensing device further includes forming a barrier layer on the planarization layer before forming the switching elements.

In an embodiment of the disclosure, the method for fabricating the sensing device further includes removing the carrier.

In an embodiment of the disclosure, the method for fabricating the sensing device further includes bonding the flexible substrate to a back plate after removing the carrier. A rigidity of the back plate is greater than a rigidity of the flexible substrate.

In order to make the above-mentioned features and advantages of the disclosure comprehensible, embodiments accompanied with drawings are described in detail below.

DETAILED DESCRIPTION OF DISCLOSED EMBODIMENTS

Figure 1A:
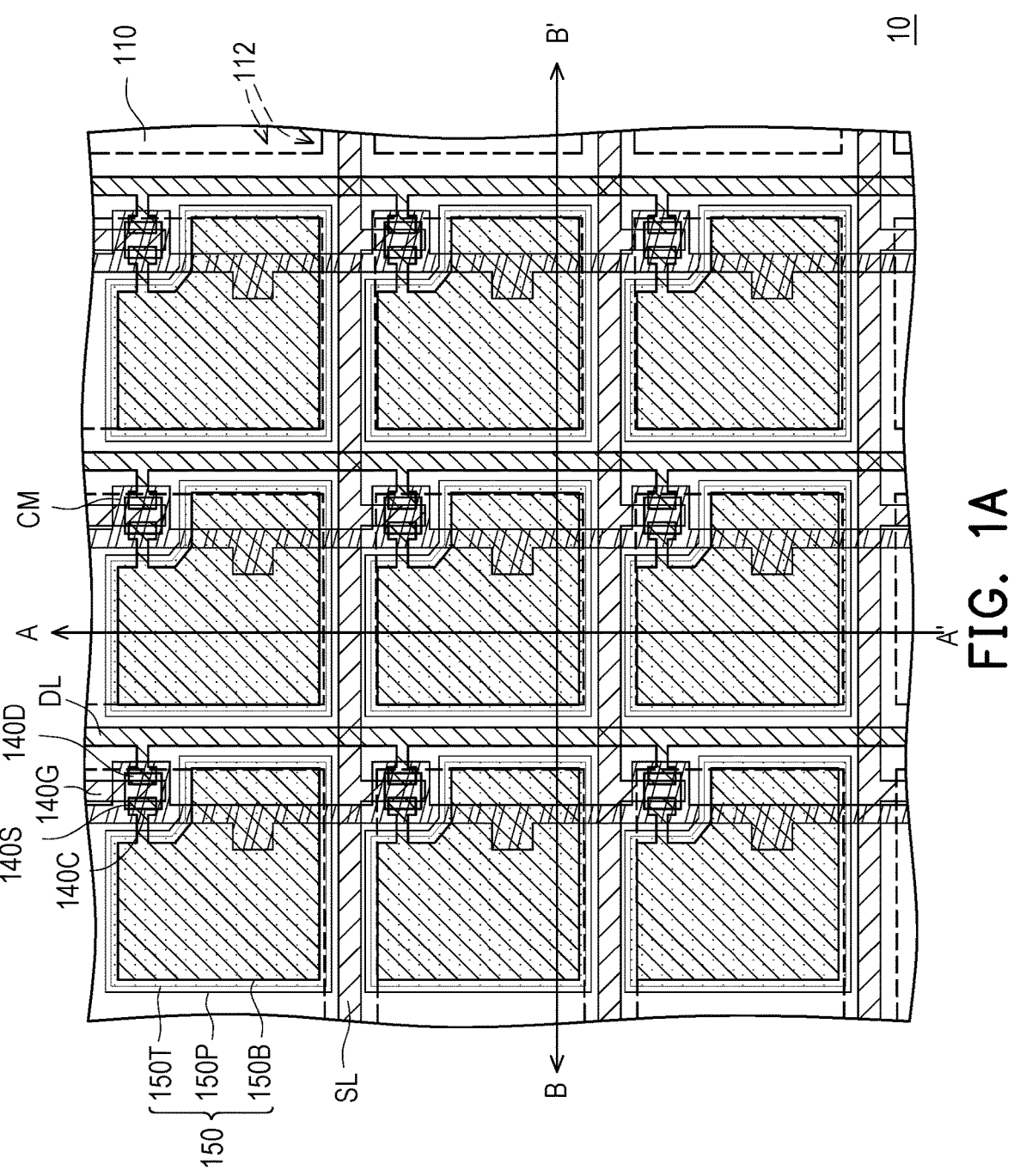
FIG. 1A is a top schematic view of a sensing device 10 according to an embodiment of the disclosure.

In the drawings, for clarity, the thickness of layers, films, plates, areas, and the like are magnified. Throughout the specification, the same reference numerals denote the same elements. It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

The terminology used herein is for the purpose of describing particular embodiments only and is not limiting. As used herein, the singular forms "a", "an", and "the" are intended to include the plural forms including "at least one" or represent "and/or" unless the content clearly dictates otherwise. As used herein, the term "and/or" includes any and all combinations of one or more of the associated listed items. It should also be understood that, when used in this specification, the term "including" or "includes" specify a presence of the stated feature, region, whole subject, step, operation, element, and/or part, but not excluding the presence or addition of one or more other features, regions, whole subjects, steps, operations, elements, parts, and/or a combination thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the accompanying drawings is flipped, an element described as being on the "lower" side of other elements shall be re-orientated to be on the "upper" side of other elements. Thus, the exemplary term "lower" may cover the orientations of "upper" and "lower", depending on the specific orientations of the accompanying drawings. Similarly, if a device in the accompanying drawings is flipped, an element described as being "below" or "beneath" other elements shall be re-orientated to be "above" other elements. Thus, the exemplary terms "below" or "beneath" may encompass both an orientation of above and below.

Considering the discussed measurement and measurement-related deviation (that is, the limitation of measurement system), the usages of "approximately", "similar to" or "substantially" indicated throughout the specification include the indicated value and an average value having an acceptable deviation range, which is a certain value confirmed by people skilled in the art. For example, "approximately" may indicate to be within one or more standard deviations of the indicated value, or being within ±30%, ±20%, ±10%, or ±5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Exemplary embodiments are described with cross-sectional views of schematic illustrations of ideal embodiments. Thus, shape alterations as a result of, for example, manufacturing techniques and/or tolerances may be expected, and the illustrated regions of the embodiments described herein should not be construed to particular shapes but include shape deviations due to, for example, manufacturing. For example, regions shown or described as being planar may generally have rough and/or non-linear features. Furthermore, the acute angles shown may be round. Therefore, the regions illustrated in the drawings are only schematic representations and are not intended to illustrate the exact shapes of the regions or to limit the scope of the claims.

Figure 1B:
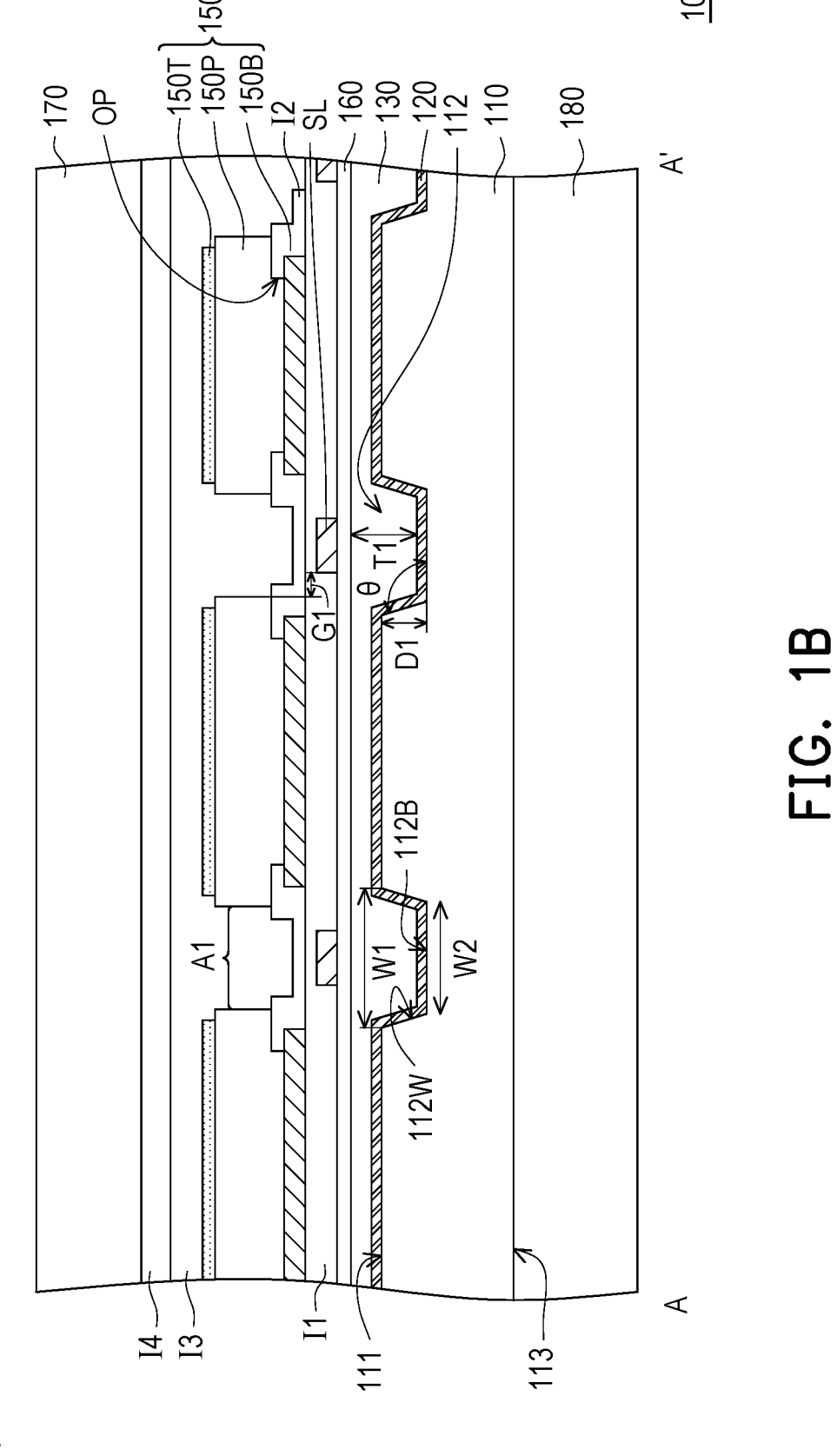
FIG. 1B is a cross-sectional schematic view along a section line A-A' of FIG. 1A.
Figure 1C:
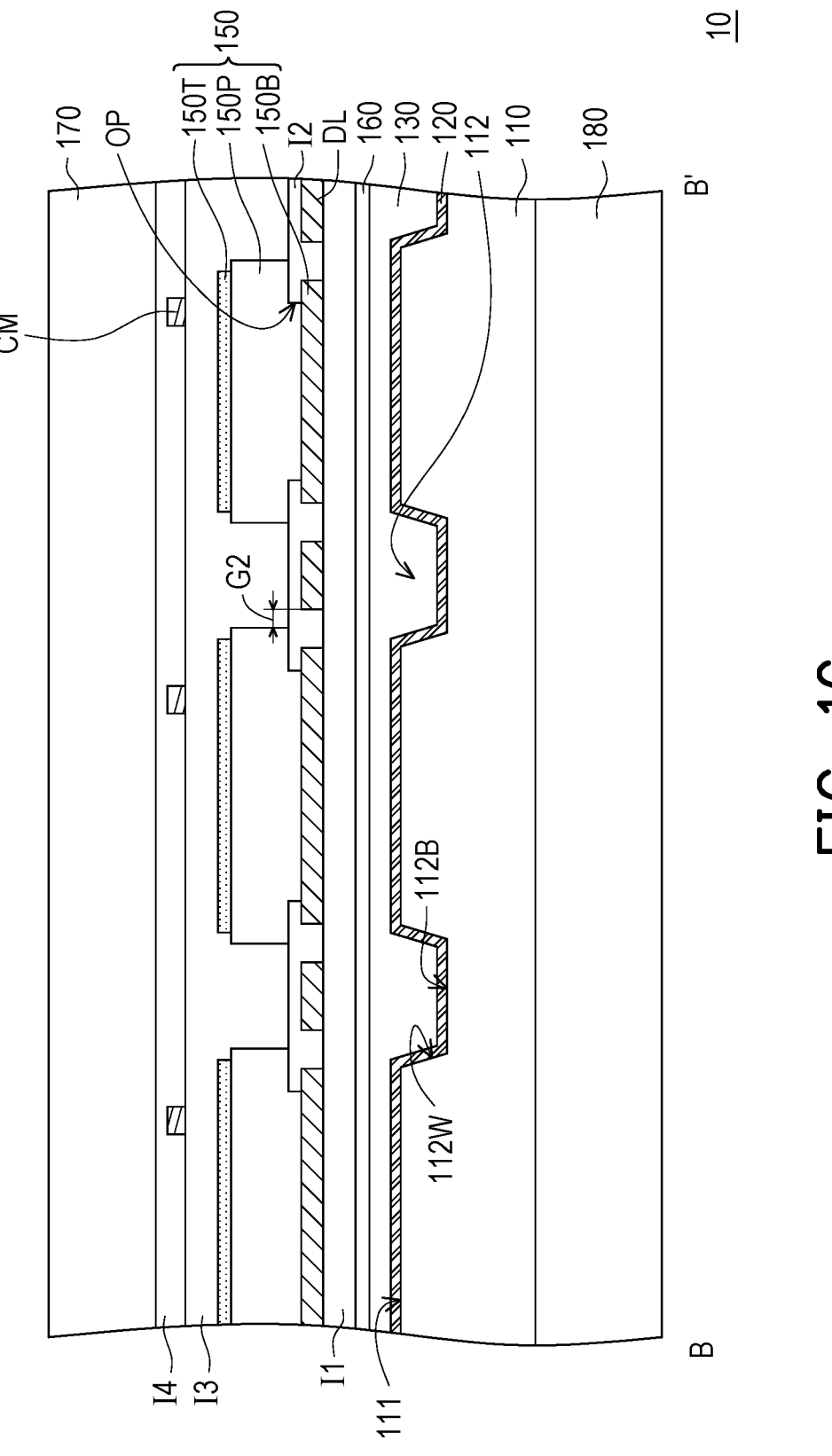
FIG. 1C is a cross-sectional schematic view along a section line B-B' of FIG. 1A.

FIG. 1A is a top schematic view of a sensing device 10 according to an embodiment of the disclosure. FIG. 1B is a cross-sectional schematic view along a section line A-A' of FIG. 1A. FIG. 1C is a cross-sectional schematic view along a section line B-B' of FIG. 1A. FIG. 1A schematically illustrates a flexible substrate 110, a switching element 140, a sensing element 150, a scan line SL, a data line DL, and a common electrode CM, and other components and film layers are omitted.

Referring to FIG. 1A to FIG. 1C, the sensing device 10 includes: a flexible substrate 110 having multiple recesses 112 on the surface; a reflective layer 120 is disposed on the flexible substrate 110 and conforms to an inner surface IS1 of the recesses 112; a planarization layer 130 is located on the reflective layer 120; multiple switching elements 140 located on the planarization layer 130; and multiple sensing elements 150 located on the planarization layer 130 and electrically connected to the switching elements 140 respectively.

In the sensing device 10 according to an embodiment of the disclosure, the interference effect of irregular reflected light is avoided by the regularly disposed recesses 112, so that the sensing quality of the sensing device 10 may be improved. Hereinafter, with reference to FIG. 1A to FIG. 1C, the implementation of each of the elements of the sensing device 10 will be continued to be described, but the disclosure is not limited thereto.

In this embodiment, the flexible substrate 110 may be a flexible substrate, such as a film type polyimide (PI), but not limited thereto. For example, the flexible substrate 110 may be a polyimide film formed by the steps of polymerization, imidization, dripping, drying, stretching, and the like, of pyromellitic dianhydride (PMDA) and diaminodiphenyl ether (ODA). In some embodiments, the thickness of the flexible substrate 110 may be about 40 μm to 400 μm, but the disclosure is not limited thereto.

The recesses 112 may be recessed into the flexible substrate 110 from a surface 111 of the flexible substrate 110. In this embodiment, the inner surface of the recesses 112 may have a side surface 112W and a bottom surface 112B, and both the side surface 112W and the bottom surface 112B have substantially planar surfaces, but not limited thereto. In some embodiments, the side surface 112W and the bottom surface 112B may have arc-shaped surfaces. Therefore, the vertical distance between the bottom surface 112B of the recesses 112 and the surface 111 of the flexible substrate 110 is the depth D1 by which the recesses 112 is recessed from the surface 111 of the flexible substrate 110. In some embodiments, an included angle θ between the side surface 112W and the bottom surface 112B may be ≥90 degrees, so that an opening width W1 of the recesses 112 is greater than a width W2 of the bottom surface 112B.

The arrangement of the recesses 112 is not particularly limited, and is preferably arranged on the surface 111 of the flexible substrate 110 in a regular manner. For example, in some embodiments, the recesses 112 may overlap the scan line SL and the data line DL, and present a mesh-like pattern on the flexible substrate 110. Each of the grids may substantially overlap a group of the switching elements 140 and the sensing elements 150 that are electrically connected to each other. In other words, the recesses 112 may surround one sensing element 150 and one switching element 140.

In this embodiment, the reflective layer 120 may be disposed on the surface 111 of the flexible substrate 110 and on the side surface 112W and the bottom surface 112B of the recesses 112, so that the reflective layer 120 may conform to the surface 111, the side surface 112W, and the bottom surface 112B, but not limited thereto. In some embodiments, the reflective layer 120 may be disposed only on the side surface 112W and the bottom surface 112B. In some embodiments, the reflective layer 120 may only be disposed on the side surface 112W and the surface 111. It is worth noting that the surface 111 is located directly below the sensing element 150, so the reflective layer 120 disposed on the surface 111 may directly reflect the incident light from above to the sensing element 150, thereby improving the light utilization rate of the sensing element 150. Since the shape and the inclination angle of the side surface 112W are consistent, the reflective layer 120 disposed on the side surface 112W may reflect incident light to the sensing element 150 in a uniform manner, thereby improving the light utilization rate of the sensing element 150. In addition, since the bottom surface 112B mainly overlaps an area A1 between the sensing elements 150, the reflective layer 120 disposed on the bottom surface 112B may also directly or indirectly reflect incident light to the sensing elements 150 in a regular manner.

The material of the reflective layer 120 may include a material with high reflectivity such as metal. For example, the reflective layer 120 may include at least one of aluminum (Al), silicon (Si), silver (Ag), gold (Au), and titanium dioxide (TiO$_2$). In addition, the reflective layer 120 may have a single-layer or multi-layer structure, for example, the multi-layer structure includes stacked layers of the above-mentioned materials or stacked layers of the above-mentioned materials and other materials. In some embodiments, the reflective layer 120 may have a floating potential or a grounding potential.

The planarization layer 130 may be filled into the recesses 112 to provide a planar surface that facilitates subsequent processing. In this embodiment, the planarization layer 130 may be formed by coating a varnish polyimide (PI). In some embodiments, a thickness T1 of the planarization layer 130 may be about 5 μm to 50 μm, e.g., 15 μm, 30 μm, or 45 μm. In some embodiments, the ratio of the depth D1 of the recesses 112 to the thickness T1 of the planarization layer 130 may be 0.5 to 0.95, such as 0.6, 0.75, or 0.9.

In some embodiments, the refractive index difference between the reflective layer 120 and the planarization layer 130 is preferably not less than 0.4, thereby increasing the substantial amount of light reflected by the reflective layer 120.

The switching elements 140 may be arranged on the planarization layer 130 in an array. For example, in this embodiment, the switching element 140 may include a semiconductor layer 140C, a gate 140G, a source 140S, and a drain 140D. An insulating layer I1 may be located between the film layer used for forming the gate 140G and the film layer used for forming the source 140S. The region where the semiconductor layer 140C overlaps the gate 140G may be regarded as a channel region of the switching element 140. The gate 140G may be electrically connected to the scan line SL, and the drain 140D may be electrically connected to the data line DL. The material of the semiconductor layer 140C may include silicon semiconductor materials (e.g., polysilicon, amorphous silicon, etc.), oxide semiconductor materials, organic semiconductor materials, and the like. Materials of the scan line SL, the data line DL, the gate 140G, the source 140S, and the drain 140D may include metals with good conductivity, such as aluminum, molybdenum, titanium, copper, and the like.

The sensing elements 150 may be arranged on the planarization layer 130 in an array, and each of the sensing elements 150 may be disposed corresponding to one switching element 140. For example, in this embodiment, each group of switching elements 140 and sensing elements 150 may have a substantially rectangular footprint and be disposed on the planarization layer 130 in an array, but the disclosure is not limited thereto, and the configuration of the switching element 140 and the sensing element 150 may be changed as required.

In this embodiment, the sensing element 150 may be a photodiode with a PIN junction structure, but is not limited thereto. In other embodiments, the sensing element 150 may be a PN diode with a PN junction structure or a sensing element adopting a silicon rich oxide (SRO) layer as a sensing layer. Alternatively, in some embodiments, the sensing element 150 may have a tandem structure in which the PN junction structure and the PIN junction structure are repeatedly arranged. For example, the sensing element 150 may include an upper electrode 150T, a lower electrode 150B, and a photoelectric conversion layer 150P, and the photoelectric conversion layer 150P is located between the upper electrode 150T and the lower electrode 150B. An insulating layer I2 may be located between the lower electrode 150B and the photoelectric conversion layer 150P. The insulating layer I2 may have multiple openings OP, the openings OP may define the disposition region of the photoelectric conversion layer 150P, and the photoelectric conversion layer 150P may contact the lower electrode 150B through the openings OP.

In some embodiments, the photoelectric conversion layer 150P may include an N-type semiconductor layer, an intrinsic semiconductor layer, and a P-type semiconductor layer, and the intrinsic semiconductor layer is sandwiched between the N-type semiconductor layer and the P-type semiconductor layer to form a PIN junction structure. The material of the intrinsic semiconductor layer may be intrinsic amorphous silicon. The material of the N-type semiconductor layer may be N-type doped amorphous silicon, such as phosphorus-doped amorphous silicon. The material of the P-type semiconductor layer may be P-type doped amorphous silicon, such as boron-doped amorphous silicon. The lower electrode 150B of the sensing element 150 may be electrically connected to the source 140S of a switching element 140. In some embodiments, the sensing device 10 may further include a common electrode CM and an insulating layer I3. The common electrode CM may be disposed above the sensing element 150, the insulating layer I3 may be disposed between the sensing element 150 and the common electrode CM, and the upper electrode 150T of the sensing element 150 may be electrically connected to the common electrode CM. In this way, the sensing element 150 may convert the received light energy into an electrical signal, and the sensing device 10 may read the electrical signal measured by the sensing element 150 through the switching element 140.

In some embodiments, the sensing device 10 may further include a scan line SL and a data line DL, the scan line SL may belong to the same film layer as the gate 140G of the switching element 140, and the scan line SL may be electrically connected to the gate 140G; the data line DL may belong to the same film layer as the source 140S and the drain 140D of the switching element 140, and the data line DL may be electrically connected to the drain 140D. In some embodiments, a gap G1 between the orthographic projection of the scan line SL on the flexible substrate 110 and the orthographic projection of the sensing element 150 on the flexible substrate 110 may completely overlap the orthographic projections of the recesses 112 on the flexible substrate 110, and a gap G2 between the orthographic projection of the data line DL on the flexible substrate 110 and the orthographic projection of the sensing element 150 on the flexible substrate 110 may completely overlap the orthographic projections of the recesses 112 on the flexible substrate 110. In this way, the light passing through the gap G1 and the gap G2 may be focused by the side surface 112W and the bottom surface 112B, so that the reflected light is not easily diffused to the sensing elements 150 on both sides, improving the image resolution.

In some embodiments, the sensing device 10 may further include a barrier layer 160, and the barrier layer 160 may be disposed between the switching element 140, the sensing element 150, and the planarization layer to prevent impurities from entering the switching element 140 and the sensing element 150, affecting the sensing performance of the sensing device 10.

In some embodiments, the sensing device 10 may further include a wavelength conversion layer 170 and an insulating layer I4, the wavelength conversion layer 170 may be disposed above the sensing element 150, and the insulating layer I4 may be disposed between the sensing element 150 and the wavelength conversion layer 170. The insulating layer I3 and the insulating layer I4 may respectively include, for example, organic insulating materials or a stack of organic insulating materials and inorganic insulating materials, so as to form a planar surface on the upper side of the sensing element 150, which facilitates the disposition of the wavelength conversion layer 170. The wavelength conversion layer 170 may convert the wavelength of light from above the sensing device 10 into a wavelength suitable for absorption by the sensing element 150, facilitating the sensing element 150 in generating a corresponding electrical signal. For example, the light from above the sensing device 10 may be X-rays, and the X-rays may be absorbed and converted into visible light after entering the wavelength conversion layer 170. The visible light travels to the sensing element 150 and is absorbed by the photoelectric conversion layer 150P to generate an electrical signal. The material of the wavelength conversion layer 170 may be a scintillator material, such as cesium iodide (CsI), thallium-doped cesium iodide (CsI:Tl), sodium-doped cesium iodide (CsI: Na), thallium-doped sodium iodide (NaI:Tl), europium-doped lithium fluoride (LiF:Eu), terbium-doped gadolinium oxysulfide ($Gd_2O_2S$:Tb), praseodymium and cerium-doped adolinium oxysulfide ($Gd_2O_2S$:Pr,Ce), gallium, cerium or fluorine-doped gadolinium oxysulfide ($Gd_2O_2S$:Pr,Ce,F), cerium-doped yttrium aluminum garnet (YAG:Ce), europium-doped cadmium iodide ($CdI_2$:Eu), terbium-doped lutetium(III) oxide ($Lu_2O_3$:Tb), poly(3-hexylthiophene-2,5-diyl) (P3HT), bismuth germanate ($Bi_4Ge_3O_{12}$), cesium lead bromide ($CsPbBr_3$), cadmium tungsten oxide ($CdWO_4$), silver-doped zinc sulfide (ZnS:Ag), cerium-doped yttrium aluminum oxide ($YAlO_3$:Ce), cerium-doped lutetium silicate ($Lu_2Si_2O_5$:Ce), cerium-doped lanthanum aluminum oxide ($LaAlO_3$:Ce), or lanthanum bromide ($LaBr_3$).

In some embodiments, the sensing device 10 may further include a back plate 180, and the back plate 180 may be located on the side of the flexible substrate 110 opposite to the planarization layer 130 to enhance the stiffness of the sensing device 10. In other words, the rigidity of the back plate 180 may be different from that of the flexible substrate 110, and the rigidity of the back plate 180 may be greater than that of the flexible substrate 110.

FIG. 2A to FIG. 2D are cross-sectional schematic views of a process flow of a method for fabricating the sensing device 10 according to an embodiment of the disclosure. Hereinafter, the method for fabricating the sensing device 10 will be described with reference to FIG. 2A to FIG. 2D.

Figures 2A, 2B:
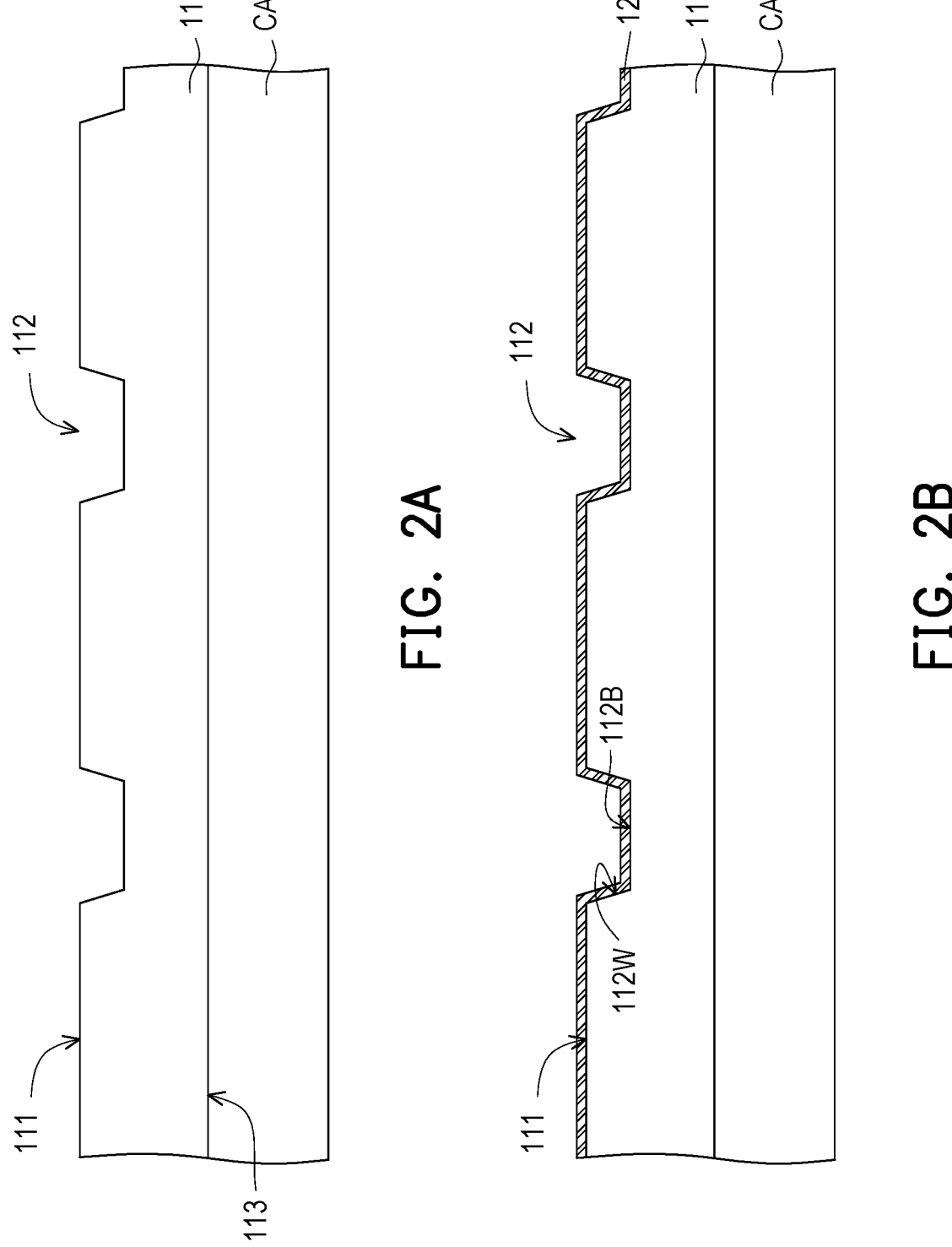
FIG. 2A to FIG. 2D are cross-sectional schematic views of a process flow of a method for fabricating the sensing device 10 according to an embodiment of the disclosure.

Referring to FIG. 2A, first, the flexible substrate 110 is formed on the carrier CA. For example, a surface 113 of the flexible substrate 110 may be bonded to the surface of the carrier CA by means of lamination. The rigidity of the carrier CA may be greater than that of the flexible substrate 110, and the glass transition temperature of the carrier CA may be higher than that of the flexible substrate 110 to facilitate subsequent steps. In this embodiment, the carrier CA is preferably a glass substrate, but not limited thereto. Multiple recesses 112 are formed on the surface 111 of the flexible substrate 110, and the recesses 112 may be formed by imprinting, but the disclosure is not limited thereto.

Referring to FIG. 2B, next, a reflective layer 120 is formed on the flexible substrate 110, and the reflective layer 120 may at least conform to the side surface 112W of the recesses 112. For example, the reflective layer 120 may conformably bond to the side surface 112W and the bottom surface 112B of the recesses 112 and the surface 111 of the flexible substrate 110.

Figure 2C:
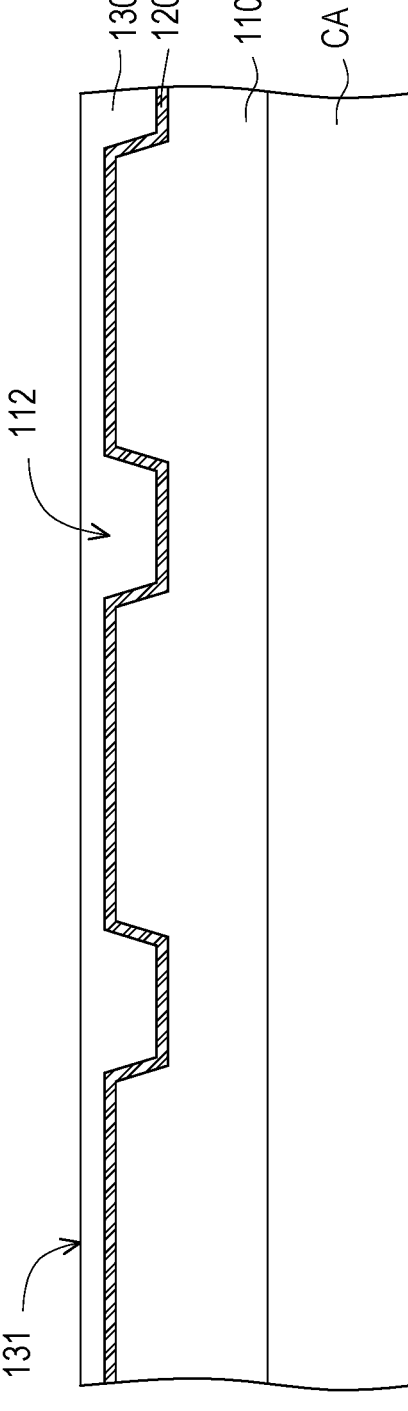

Referring to FIG. 2C, next, a planarization layer 130 is formed on the reflective layer 120, and the planarization layer 130 fills the recesses 112, so as to prevent the height fluctuation of the recesses 112 from affecting the subsequent steps. The planarization layer 130 may be formed by coating, such as roll coating, spin coating, bar coating, screen coating, blade coating, or the like, so that a surface 131 of the planarization layer 130 may have a surface flatness of not less than 90%.

Figure 2D:
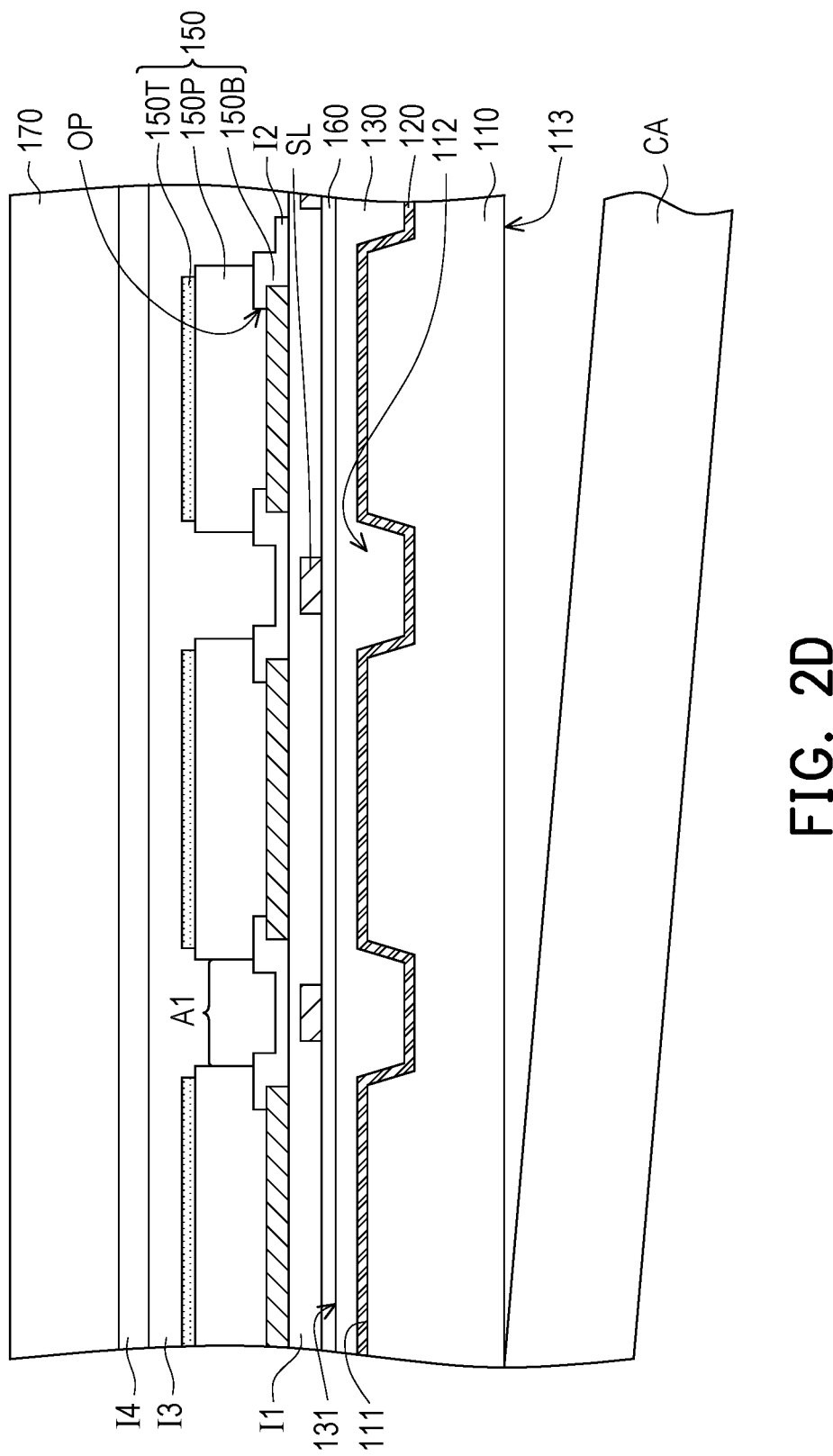

Next, referring to FIG. 1A and FIG. 2D at the same time, multiple switching elements 140, multiple sensing elements 150, a scan line SL, and a data line DL are formed on the planarization layer 130, and the sensing elements 150 are respectively electrically connected to the switching elements 140, and each of the switching elements 140 is electrically connected to the scan line SL and the data line DL. For example, the lower electrode 150B of the sensing element 150 may be electrically connected or physically connected to the source 140S of the switching element 140, the gate 140G of the switching element 140 is electrically connected to the scan line SL, and the drain 140D of the switching element 140 is electrically connected to the data line DL. In some embodiments, the barrier layer 160 may also be formed on the surface 131 of the planarization layer 130 before the switching element 140 is formed, so as to prevent impurities from entering the switching element 140 and affecting the performance of the switching element 140.

In some embodiments, the insulating layer I3 and the common electrode CM may be formed on the switching element 140 and the sensing element 150 after the switching element 140 and the sensing element 150 are formed, and the insulating layer I3 is located between the common electrode CM, and the switching element 140 and the sensing element 150. In some embodiments, the insulating layer I4 and the wavelength conversion layer 170 may be formed on the switching element 140 and the sensing element 150 after the switching element 140 and the sensing element 150 are formed, and the insulating layer I4 is located between the wavelength conversion layer 170, and the switching element 140 and the sensing element 150. The insulating layer I3 and the insulating layer I4 may provide a planar top surface for disposing the common electrode CM and the wavelength conversion layer 170, which may convert the wavelength of light from above the sensing device 10 into a wavelength suitable for absorption by the sensing element 150. Next, the carrier CA may be removed to expose the surface 113 of the flexible substrate 110.

Next, the flexible substrate 110 may be bonded to the back plate 180 to complete the sensing device 10 shown in FIG. 1A to FIG. 1C. In some embodiments, the rigidity of the back plate 180 may be greater than that of the flexible substrate 110 to enhance the stiffness of the sensing device 10. For example, an adhesive material may be used to adhere the surface 113 of the flexible substrate 110 to the surface of the back plate 180. The material of the back plate 180 may be polyethylene terephthalate (PET), polyethylene naphthalate (PEN), or polyimide (PI), but not limited thereto.

Hereinafter, other embodiments of the disclosure will be described with reference to FIG. 3A to FIG. 6, and the reference numbers and related contents of the embodiments of FIG. 1A to FIG. 1C will be used. The same or similar reference numerals are used to denote the same or similar elements, and the description of the same technical content is omitted. For the description of the omitted part, reference may be made to the embodiments of FIG. 1A to FIG. 1C, which will not be repeated in the following description.

Figure 3A:
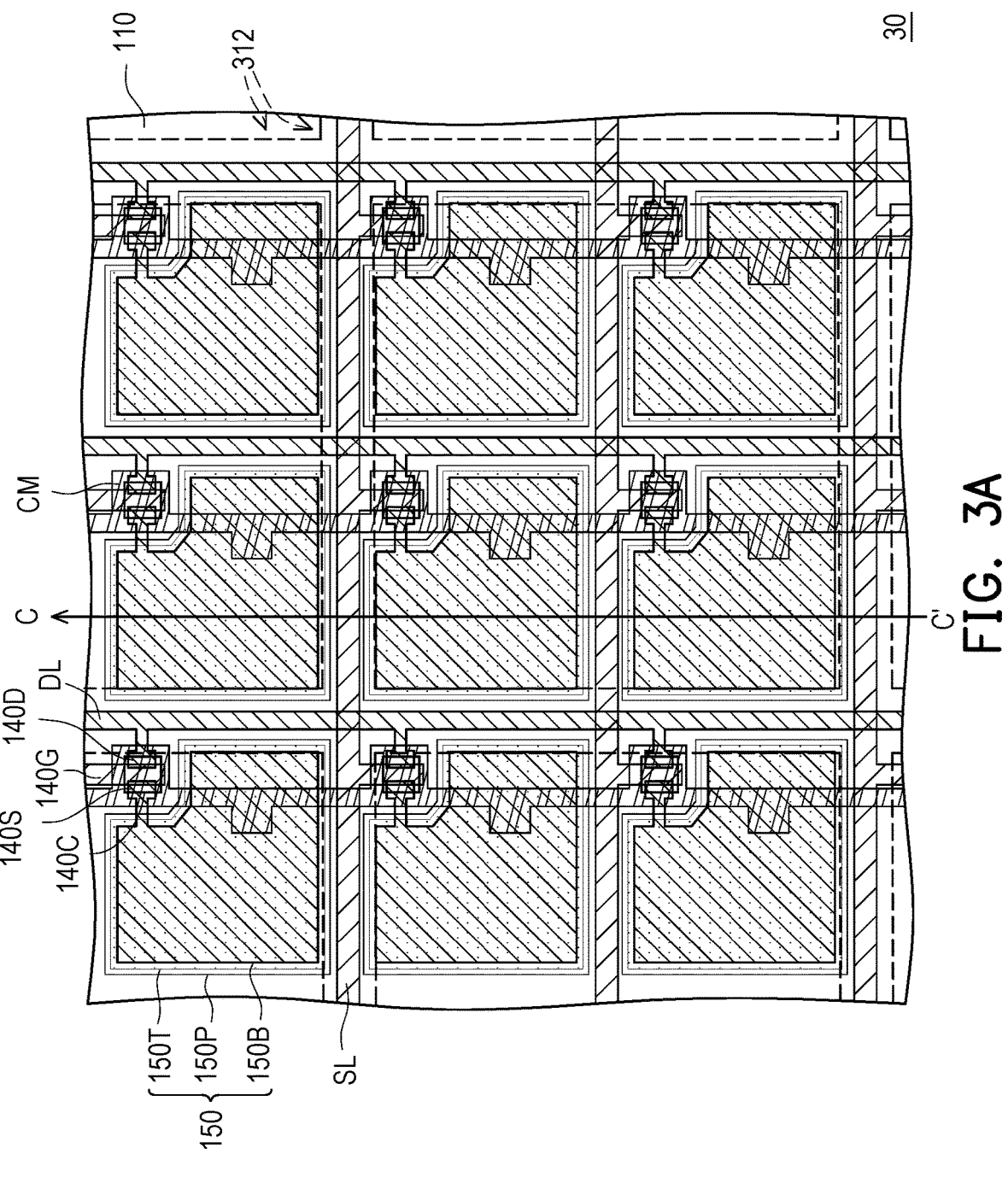
FIG. 3A is a top schematic view of a sensing device 30 according to an embodiment of the disclosure.
Figure 3B:
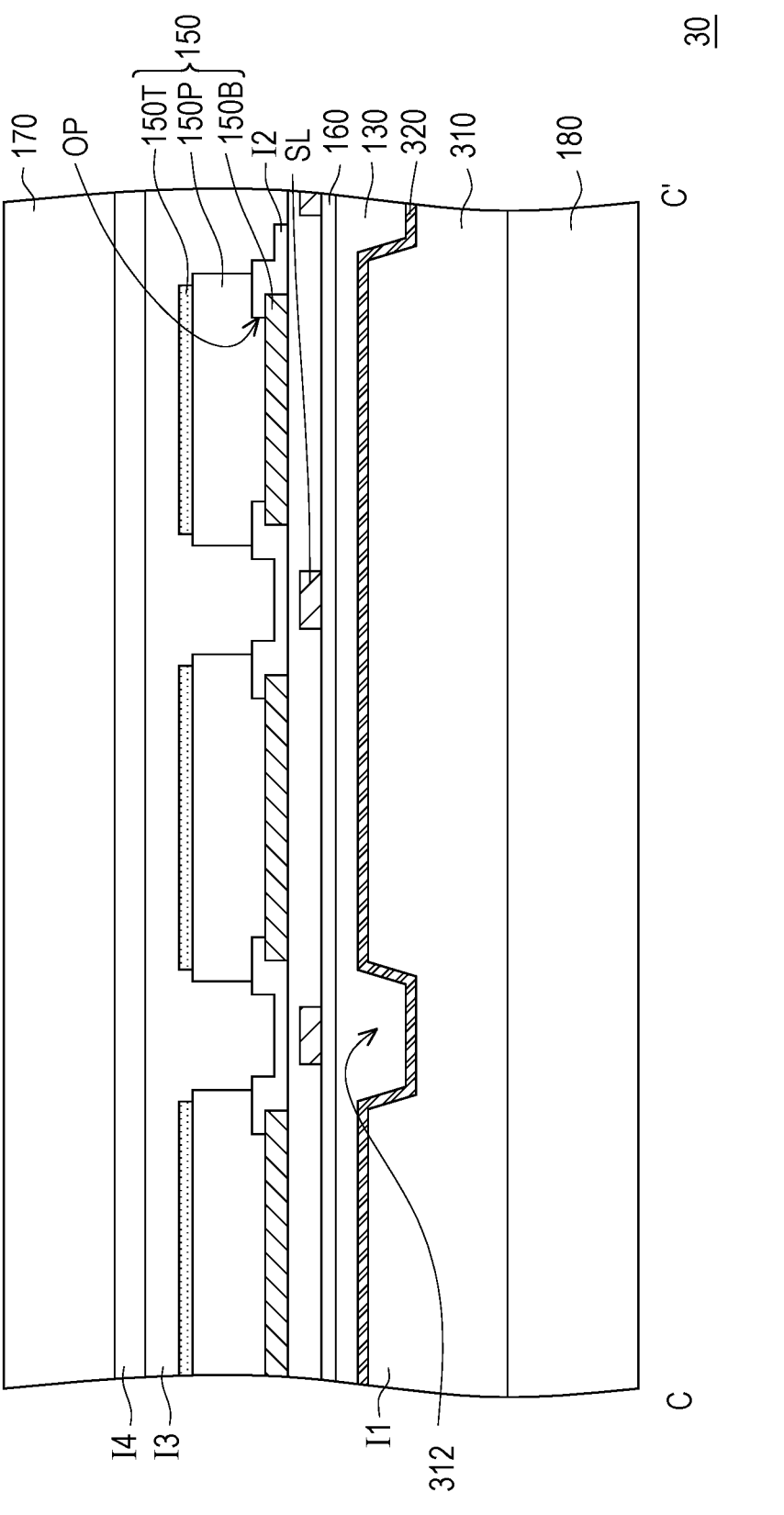
FIG. 3B is a cross-sectional schematic view along a section line C-C' of FIG. 3A.

FIG. 3A is a top schematic view of a sensing device 30 according to an embodiment of the disclosure. FIG. 3B is a cross-sectional schematic view along a section line C-C' of FIG. 3A. Referring to FIG. 3A to FIG. 3B, the sensing device 30 includes a flexible substrate 310 having multiple recesses 312 on the surface, a reflective layer 320, a planarization layer 130, multiple switching elements 140, multiple sensing elements 150, a barrier layer 160, a wavelength conversion layer 170, a data line DL, a scan line SL and a back plate 180.

The main difference between the sensing device 30 shown in FIG. 3A to FIG. 3B and the sensing device 10 shown in FIG. 1A to FIG. 1C is that the recesses 312 of the sensing device 30 may surround four sensing elements 150 and four switching element 140. In this way, the distribution area of the recesses 312 may be reduced, and the portion of the reflective layer 320 located in the recesses 312 may still prevent the reflected light from diffusing to the sensing elements 150 on both sides, so that the image resolution may be improved, thereby improving the sensing quality of the sensing device 30. In other embodiments, the recesses 312 may also surround more sensing elements 150 and switching elements 140.

Figure 4:
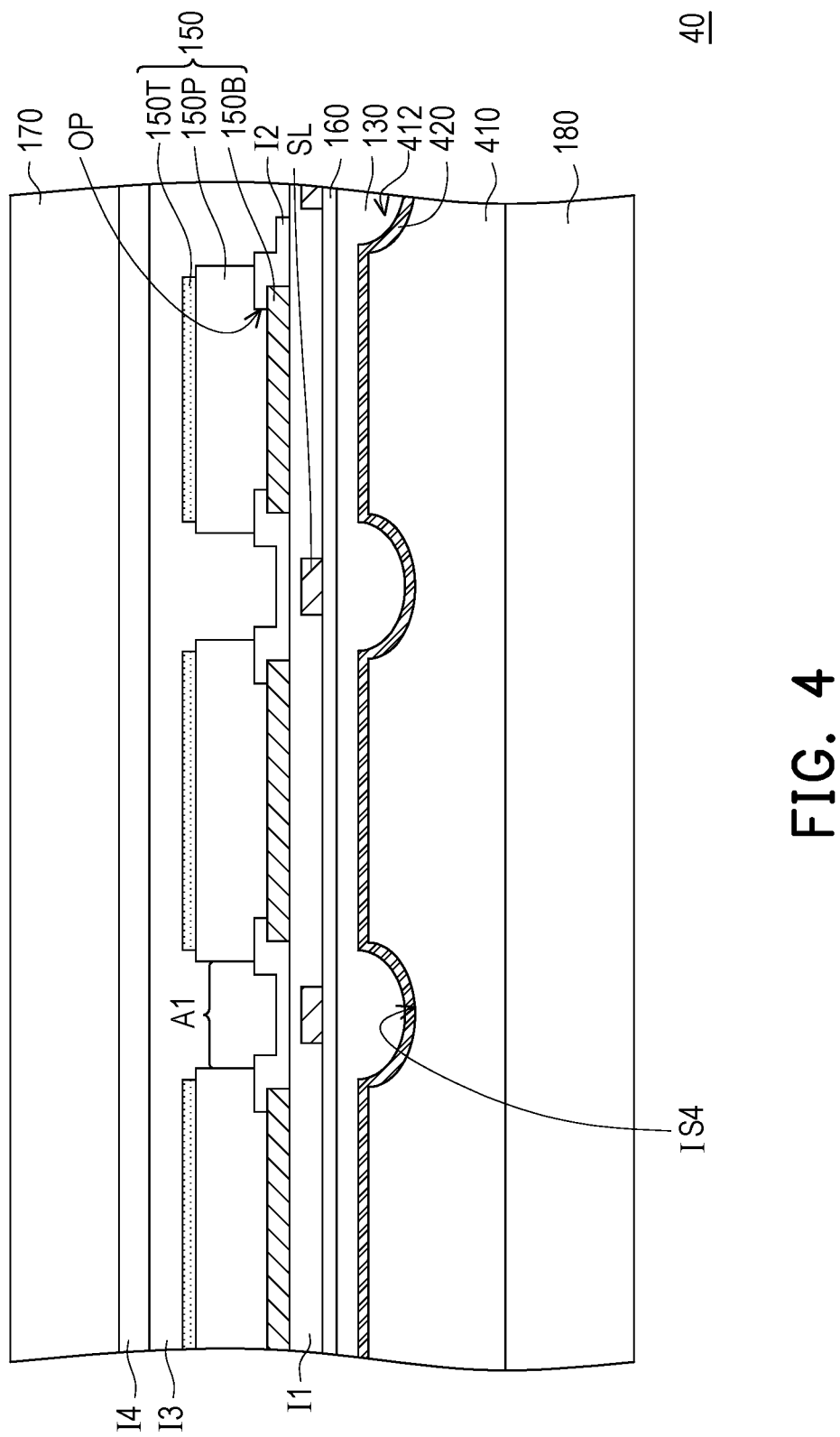
FIG. 4 is a cross-sectional schematic view of a sensing device 40 according to an embodiment of the disclosure.

FIG. 4 is a cross-sectional schematic view of a sensing device 40 according to an embodiment of the disclosure. The sensing device 40 includes a flexible substrate 410 having multiple recesses 412 on the surface, a reflective layer 420, a planarization layer 130, multiple sensing elements 150, a barrier layer 160, a wavelength conversion layer 170, a scan line SL, insulating layers I1 to I4, and a back plate 180. The main difference between the sensing device 40 shown in FIG. 4 and the sensing device 10 shown in FIG. 1A to FIG. 1C is that an inner surface IS4 of the recesses 412 of the sensing device 40 may have an arc-shaped surface, and an area A1 between the sensing elements 150 completely overlaps the inner surface IS4 of the recesses 412. In this way, the portion of the reflective layer 420 located in the inner surface IS4 of the recesses 412 also has an arc-shaped surface, so that the light incident on the reflective layer 420 through the area A1 may be focused by the arc-shaped surface, so that the reflected light is not easily diffused to the sensing elements 150 on both sides, improving the image resolution.

Figure 5:
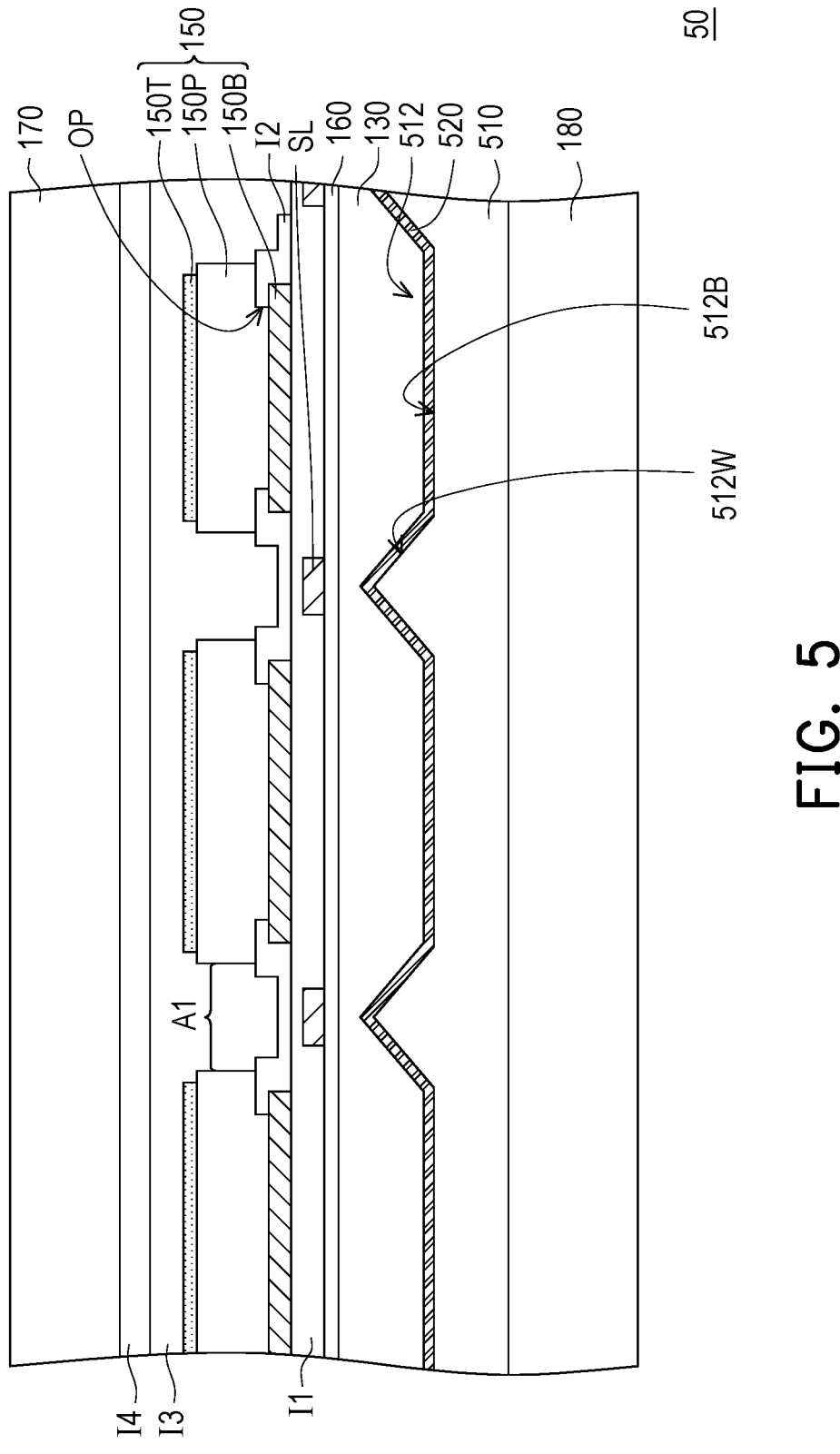
FIG. 5 is a cross-sectional schematic view of a sensing device 50 according to an embodiment of the disclosure.

FIG. 5 is a cross-sectional schematic view of a sensing device 50 according to an embodiment of the disclosure. The sensing device 50 includes a flexible substrate 510 having multiple recesses 512 on the surface, a reflective layer 520, a planarization layer 130, multiple sensing elements 150, a barrier layer 160, a wavelength conversion layer 170, a scan line SL, insulating layers I1 to I4, and a back plate 180. The main difference between the sensing device 50 shown in FIG. 5 and the sensing device 10 shown in FIG. 1A to FIG. 1C is that the orthographic projection of each of the sensing elements 150 of the sensing device 50 on the flexible substrate 510 may completely fall within the orthographic projection of each of the recesses 512 on the flexible substrate 510. In some embodiments, the sensing elements 150 may overlap the bottom surface 512B of the recesses 512, the area A1 between the sensing elements 150 may overlap the side surfaces 512W of the recesses 512, and each of the recesses 512 only overlaps one sensing element 150. In this way, the light incident through the area A1 may be reflected to the sensing element 150 in a uniform manner by the reflective layer 520 disposed on the side surface 512W, and the reflective layer 520 disposed on the bottom surface 512B may directly reflect the incident light from above to the sensing element 150, thereby improving the light utilization rate of the sensing device 50.

Figure 6:
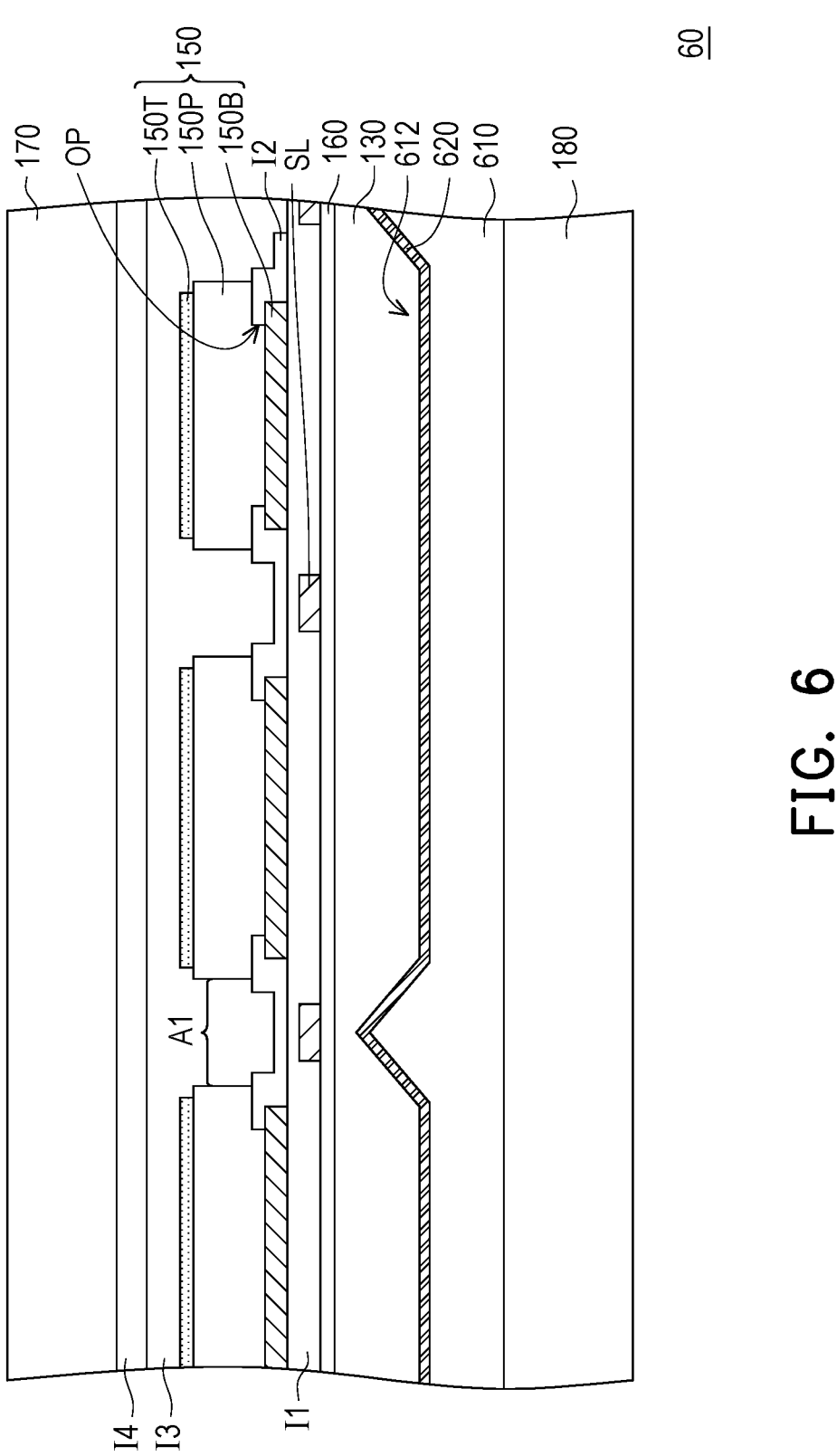
FIG. 6 is a cross-sectional schematic view of a sensing device 60 according to an embodiment of the disclosure.

FIG. 6 is a cross-sectional schematic view of a sensing device 60 according to an embodiment of the disclosure. The sensing device 60 includes a flexible substrate 610 having multiple recesses 612 on the surface, a reflective layer 620, a planarization layer 130, multiple sensing elements 150, a barrier layer 160, a wavelength conversion layer 170, a scan line SL, insulating layers I1 to I4, and a back plate 180. The main difference between the sensing device 60 shown in FIG. 6 and the sensing device 50 shown in FIG. 5 is that the recesses 612 of the sensing device 60 may overlap multiple sensing elements 150, such as two, four, or nine sensing elements 150. In this way, the distribution area of the side surface of the recesses 612 may be reduced, and the reflective layer 620 may still reflect light to the sensing element 150 in a uniform manner, thereby improving the light utilization rate of the sensing device 60.

To sum up, the sensing device of the disclosure may improve the uniformity of reflected light and improve the sensing quality, and improve the light utilization rate at the same time by fabricating regular recesses on the flexible substrate and disposing the reflective layer disposed on the recesses.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A sensing device, comprising:
a flexible substrate, having a plurality of recesses on a surface;
a reflective layer, located on the flexible substrate and conforming to an inner surface of the recesses;
a planarization layer, located on the reflective layer;
a plurality of switching elements, located on the planarization layer; and
a plurality of sensing elements, located on the planarization layer and electrically connected to the switching elements respectively,
wherein the reflective layer extends continuously along the surface with the recesses of the flexible substrate.

2. The sensing device according to claim 1, wherein the inner surface of the recesses has a side surface and a bottom surface that are planar.

3. The sensing device according to claim 2, wherein an opening width of the recesses is greater than a width of the bottom surface.

4. The sensing device according to claim 1, wherein the recesses have a mesh-like pattern.

5. The sensing device according to claim 1, wherein a ratio of a depth of the recesses to a thickness of the planarization layer is 0.5 to 0.95.

6. The sensing device according to claim 1, wherein the reflective layer has a floating potential or a grounding potential.

7. The sensing device according to claim 1, wherein a refractive index difference between the reflective layer and the planarization layer is not less than 0.4.

8. The sensing device according to claim 1, further comprising a data line and a scan line, electrically connected to the switching elements, wherein a gap between an orthographic projection of the data line, the scan line, and the sensing element on the flexible substrate completely overlaps an orthographic projection of the recesses on the flexible substrate.

9. The sensing device according to claim 1, wherein the flexible substrate is a film type polyimide (PI).

10. The sensing device according to claim 9, wherein a thickness of the flexible substrate is 40 μm to 400 μm.

11. The sensing device according to claim 1, wherein the planarization layer includes varnish polyimide (PI).

12. The sensing device according to claim 11, wherein a thickness of the planarization layer is 5 μm to 50 μm.

* * * * *